United States Patent [19]
Ludikhuize

[11] Patent Number: 5,883,413
[45] Date of Patent: *Mar. 16, 1999

[54] LATERAL HIGH-VOLTAGE DMOS TRANSISTOR WITH DRAIN ZONE CHARGE DRAINING

[75] Inventor: Adrianus W. Ludikhuize, Eindhoven, Netherlands

[73] Assignee: U.S. Philips Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 687,110

[22] Filed: Jul. 16, 1996

[30] Foreign Application Priority Data

Jul. 19, 1995 [EP] European Pat. Off. ............... 95201989

[51] Int. Cl.$^6$ ........................... H01L 29/76; H01L 29/94; H01L 23/58
[52] U.S. Cl. ......................... 257/343; 257/409; 257/492; 257/493
[58] Field of Search ................................... 257/343, 409, 257/492, 493

[56] References Cited

U.S. PATENT DOCUMENTS

| | | | |
|---|---|---|---|
| 4,300,150 | 11/1981 | Colak | 257/339 |
| 4,989,058 | 1/1991 | Colak et al. | 257/493 |
| 5,635,742 | 6/1997 | Hosi et al. | 257/343 |

FOREIGN PATENT DOCUMENTS

| | | | |
|---|---|---|---|
| 0514060A2 | 11/1992 | European Pat. Off. | 257/343 |
| 2128536 | 12/1971 | Germany | 257/343 |

Primary Examiner—Steven H. Loke
Attorney, Agent, or Firm—Steven R. Biren

[57] ABSTRACT

In many circuits in which a current is switched off, a high voltage appears at the drain electrode of a transistor, in particular in the case of an inductive load. When a lateral high-voltage DMOST is used, such a high voltage may lead to instability in the transistor characteristics or may even damage the transistor. To avoid this problem, the drain of a high-voltage LDMOST is locally provided with a strongly doped n-type zone 18, 21 (in the case of an n-channel transistor) which extends, seen from the surface, down into the semiconductor body to a greater depth than does the source zone 8, so that a pn-junction is formed at a comparatively great depth in the semiconductor body having a breakdown voltage that is lower than the $BV_{ds}$ of the transistor without this zone. The energy stored in the inductance may thus be drained off through breakdown of the pn-junction. This breakdown is separated from the normal current path of the transistor owing to the comparatively great depth of the pn-junction, so that the robustness of the transistor is improved. This deep zone in the drain may be formed, for example, by a buried layer at the boundary between an epitaxial layer and the substrate.

8 Claims, 1 Drawing Sheet

LATERAL HIGH-VOLTAGE DMOS TRANSISTOR WITH DRAIN ZONE CHARGE DRAINING

BACKGROUND OF THE INVENTION

The invention relates to a semiconductor device with a high-voltage lateral MOS transistor (HV-LDMOST), comprising a semiconductor body with a comparatively weakly doped silicon substrate of a first conductivity type and provided thereon a comparatively weakly doped epitaxial layer adjoining a surface of the semiconductor body, while the transistor comprises a comparatively strongly doped drain zone situated at the surface and of a second conductivity type opposed to the first conductivity type, a comparatively weakly doped drift region of the second conductivity type, a comparatively strongly doped source zone of the second conductivity type which adjoins the surface and is provided in a base region of the first conductivity type also adjoining the surface, and a control electrode provided above the surface and electrically insulated therefrom.

Such a device is known, for example, from the published Patent Application EP-A 0 514 060 A2. The epitaxial layer in this known device is of the same conductivity type as the substrate, so the p-type in usual embodiments. The drift region is formed by a comparatively weakly doped n-type surface layer provided in the epitaxial layer. The base region or "body region" of the transistor is formed by a p-type surface zone which is provided in the epitaxial layer and which is usually short-circuited with the strongly doped n-type source zone formed in this zone. Below the base region and conductively connected thereto, a strongly doped p-type buried layer is provided at the boundary between the high-ohmic p-type substrate and the also high-ohmic epitaxial layer. Peaks in the electric field distribution at the edge of the control electrode above the drift region are smoothed out by this buried zone, so that the breakdown voltage can be increased. Depending on various parameters such as the doping concentrations and thicknesses of various regions, a breakdown voltage of a few hundreds of volts up to more than 1,000 volts may be obtained. The RESURF principle known from the literature may advantageously be used for increasing the breakdown voltage, while the doping and thickness of the drift region are so chosen that this region is depleted throughout its thickness at least locally in a direction transverse to the surface, for example from the pn-junction opposite the surface, possibly in conjunction with field plates at the surface, before breakdown has occurred. This depletion leads to a reduction in the electric field and thus an increase in the breakdown voltage.

In many applications in which strong currents are switched on and off, high voltage peaks occur at the drain of the switching transistor upon switching-off, in particular as a result of inductive loads. In a vertical DMOST, breakdown across the pn-junction between the back gate and the drain may be use the inductance. This breakdown may be brought to a desired value by means of an extra doping in the back gate outside the channel region. Such a provision, however, is not known in the present art of a lateral high-voltage DMOST.

In versions of a lateral high-voltage DMOST in which the length of the drift region is sufficiently great, breakdown across the pn-junction of the drain zone opposite the surface will in the end still take place with an increasing voltage at the drain, so that the inductively stored power can be drained off through the source contact. This solution, however, is not feasible in most cases because usually a smaller distance between the source and drain zones is chosen with the object of keeping the on-resistance ($R_{on}$) of the transistor low. As a result, the breakdown voltage of the pn-junction between the drain zone and the semiconductor body lies at a much higher level than the $BV_{ds}$ (source-drain breakdown voltage) of the transistor. This latter form of breakdown often has the result that certain properties of the transistor such as, for example, the threshold voltage change, sometimes even leads to destruction of the transistor, and is accordingly not useful for dealing with said voltage peaks at the drain.

SUMMARY OF THE INVENTION

The invention has for its object inter alia to provide a semiconductor device with a lateral high-voltage DMOS transistor which is provided with means for effectively draining off the electric charge corresponding to high voltage peaks at the transistor drain, while degradation of transistor properties is avoided.

According to the invention, a semiconductor device of the kind described in the opening paragraph is characterized in that the drain zone comprises a strongly doped zone of the second conductivity type which, seen from the surface, extends more deeply into the semiconductor body than does the source zone, so that a pn-junction is formed with a breakdown voltage which is lower than the $BV_{ds}$ of the transistor in the absence of said zone, and in the case of breakdown forms a current path which is separated from the current path between source and drain when the transistor is in the conducting state.

The invention utilizes the fact that a lateral DMOST usually forms part of an integrated circuit which comprises besides the DMOST other circuit elements such as bipolar transistors or CMOS circuits. This means that the construction of the DMOST can often be changed without changing the production process for obtaining a desired breakdown voltage. When the drain is provided with a deep, strongly doped zone of the second conductivity type, a pn-junction is obtained which is situated comparatively deep in the semiconductor body and which has the desired breakdown voltage. Since the breakdown does not take place in the normal current path of the transistor, the normal current conduction of the transistor is not or substantially not influenced by the additional pn-junction of the drain.

Usually, a comparatively strongly doped zone of the same conductivity type as but with a higher doping concentration than the substrate is provided at the boundary between the epitaxial layer and the substrate, which zone, seen at the surface, extends from the source zone up to or at least substantially up to the drift region.

The epitaxial layer in an embodiment may be of the first conductivity type, i.e. the same conductivity type as the substrate, as is the case in the known device described above. An alternative embodiment of the invention is characterized in that the epitaxial layer is of the second conductivity type, while the drift region is formed by a portion of the epitaxial layer between the drain zone and the base region. A further embodiment of the invention is characterized in that the drain comprises a strongly doped buried zone of the second conductivity type which is provided at the boundary between the epitaxial layer and the substrate at the area of the drain. The buried zone of the second conductivity type may usually be manufactured simultaneously with zones of other circuit elements, for example buried collector zones of bipolar transistors. A preferred embodiment of the invention which also comprises a buried zone of the first conductivity type below the base region of the transistor is characterized in that the distance between the buried zone of the first conductivity type and the buried zone of the second conductivity type defines the breakdown voltage across the pn-junction between the drain and the semiconductor body. Breakdown here takes place between two buried layers and is accordingly sufficiently separated from the normal current path in the transistor drift region, so that an early multiplication in the drift region is prevented when the transistor becomes conducting. The current path during breakdown is at the same time made comparatively low-ohmic. A further embodiment of a semiconductor device according to the invention which may advantageously be used for higher voltages is characterized in that the drain comprises a strongly doped surface zone of the second conductivity type which extends from the surface into the semiconductor body down to a greater depth than does the source zone.

BRIEF DESCRIPTION OF THE DRAWING

These and other aspects of the invention will be explained in more detail with reference to several embodiments. In the drawing.

DESCRIPTION OF THE PREFERRED EMBODIMENTS

Figure 1:
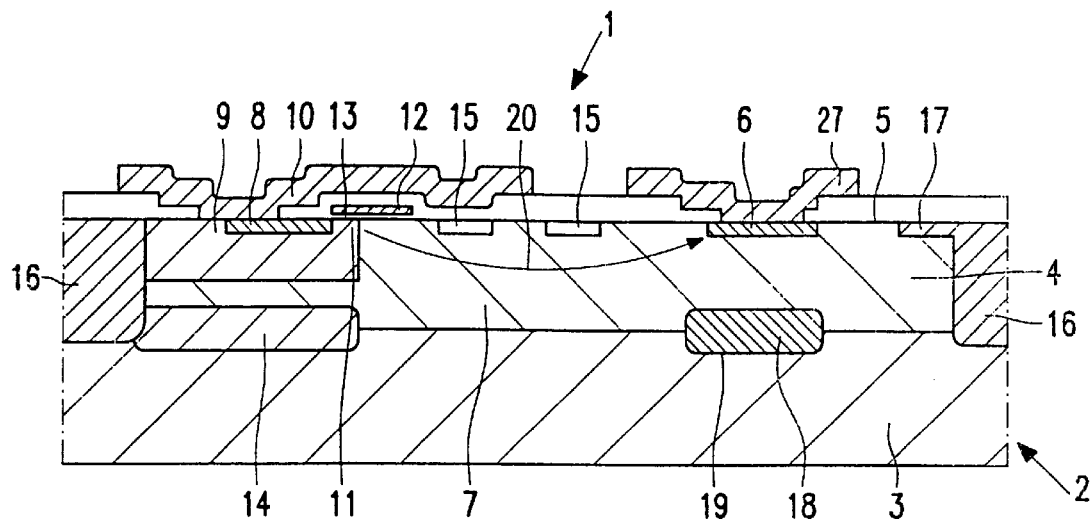
FIG. 1 is a cross-section of a first embodiment of an LDMOST according to the invention.

FIG. 1 is a cross-section of a first embodiment of a lateral high-voltage DMOS transistor 1 according to the invention. The transistor according to this embodiment is of the n-channel type, but it will be obvious that the transistor may alternatively be of the p-channel type, for which purpose it suffices to reverse the conductivity types mentioned below. The transistor may form part of an integrated circuit with other components which are accommodated together with the transistor in a common semiconductor body. Since nothing is changed in the construction of these other components, the drawing shows the LDMOST 1 only. The transistor is provided in a semiconductor body 2 of silicon with a comparatively weakly doped substrate 3 and an also comparatively weakly doped epitaxial layer 4 grown thereon and adjoining the surface 5 in view of the high voltages at which the device is operated, for example between 700 V and 1,200 V. The substrate 3 is of p-type <100> silicon with a doping concentration of approximately $1.5*10^{14}$ atoms per $cm^3$, corresponding to a resistivity of approximately 90 Ohm.cm. The epitaxial layer 4 in this example is of n-type silicon with a doping concentration of approximately $7*10^{14}$ atoms per $cm^3$, i.e. a resistivity of approximately 6 Ohm.cm. The thickness of the epitaxial layer is approximately 23 $\mu$m. The transistor comprises a drain in the form of a strongly doped n-type surface zone 6 which is connected to the drain electrode 27. The drain adjoins a portion 7 of the epitaxial layer which forms a drift region of the transistor and which is weakly doped compared with the drain zone 6. The source zone is formed by an n-type strongly doped surface zone 8 provided in a p-type zone 9 which also adjoins the surface and which forms the base region (body zone) of the transistor. The source zone 8 and the base region 9 are conductively interconnected by the source electrode 10. The channel region of the transistor is formed by that portion 11 of the zone 9 which is situated between the source zone 8 and the drift region 7. A gate electrode 12 is situated above the channel region and is insulated from the channel by the gate oxide 13. The thickness of the gate oxide 13 is, for example, 0.1 $\mu$m. Obviously, the gate dielectric may also comprise materials other than silicon oxide or may comprise a combination of different materials. To increase the breakdown voltage, a p-type buried zone 14 of the same conductivity type as but with a higher doping concentration than the substrate 3 is provided at the boundary between the epitaxial layer and the substrate. Said buried layer extends below the base zone 9 up to the drift region 7. As is described inter alia in the cited European Patent Application EP-A 0 514 060, the zone 14 reduces the electric field strength at the surface below the gate electrode 12, so that the breakdown voltage is increased. If so desired, one or several voltage-raising zones in the form of electrically floating p-type surface zones 15 may be formed in the drift region for further increasing the breakdown voltage. The source and/or drain electrodes 27, 10 may be constructed as field plates, and accordingly extend over a substantial portion of the drift region as shown in the drawing, in order to reduce the electric field strength at the surface further. The transistor is electrically insulated from other components in the semiconductor body 2 by means of the p-type island insulation zones 16 which extend from the surface 5 down into the substrate. These zones may possibly be formed by two zones each time, one of which is diffused from the surface in downward direction and the other from a buried layer in upward direction until the zones form a combined p-type region. The latter zone may be formed simultaneously with the buried layer 14 in that case. To prevent electric breakdown, the deep p-type zones 16 may be provided with breakdown voltage raising extensions 17 which are provided simultaneously with the zones 15.

According to the invention, the drain zone comprises a strongly doped n-type zone 18 which, seen from the surface, extends into the semiconductor body to a greater depth than does the source zone 8. The zone 18 as a result forms a pn-junction 19 with the surrounding portion of the semiconductor body at a comparatively great distance from the surface 5, with a breakdown voltage which is lower than the breakdown voltage $BV_{ds}$ between source and drain of the transistor. In the present example, where the zone 18 is formed by a buried zone, the pn-junction 19 is formed between the zone 18 and the p-type substrate 3. The doping concentration of the buried zone 18 is, for example, $5*10^{18}$ atoms per $cm^3$.

Given the above doping concentrations and thicknesses, it is possible to manufacture a transistor with a $BV_{ds}$, of, for example, 800 V, for which the RESURF principle known from the literature can be utilized. According to this principle, the thicknesses and doping concentrations of the epitaxial layer are chosen such that said layer, or at least the drift region, is depleted throughout its thickness, for example from the blocked pn-junction between substrate and epitaxial layer and from the surface, before one of the pn-junctions adjacent the surface breaks down. The breakdown voltage of the pn-junction 19 is approximately 500 V. Breakdown will take place across the pn-junction 19 before breakdown takes place across the transistor when, for example, a high peak voltage arises at the drain caused by an inductive load upon switching-off. The electric charge associated with this high voltage may then be drained off through the substrate and the source contact 10. This current path is spatially fully separated from the normal current path 20 of the transistor when it is conducting. As a result, the presence of the buried zone 18 will cause no or at least substantially no multiplication in the current path of the transistor, so that the stability of the transistor remains satisfactory.

Figure 2:
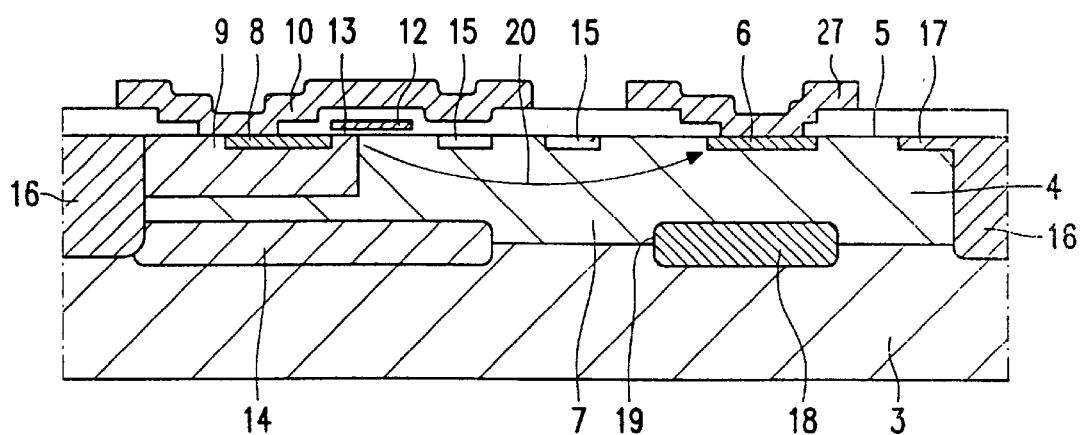
FIG. 2 is a cross-section of a second embodiment of an LDMOST according to the invention.

FIG. 2 shows a modification of the device of FIG. 1, where the distance between the buried layers 14 and 18 is made so small that breakdown takes place between the buried layers instead of between the buried layer 18 and the substrate 3. This embodiment may be advantageously utilized in situations where a lower breakdown voltage is required than can be achieved in the embodiment of FIG. 1. In a practical realization, the distance between the buried layers was, for example, 50 μm, and a breakdown voltage of approximately 500 V was obtained. It is noted in this connection that a breakdown voltage of a desired value may also be obtained in an alternative version in which the zone 14 extends close to the drain zone 6 and the zone 18 is omitted. This transistor, however, showed a comparatively low stability because electric breakdown occurred in or close to the current path 20 of the transistor, so that it is less useful, or even of no use at all.

Figure 3:
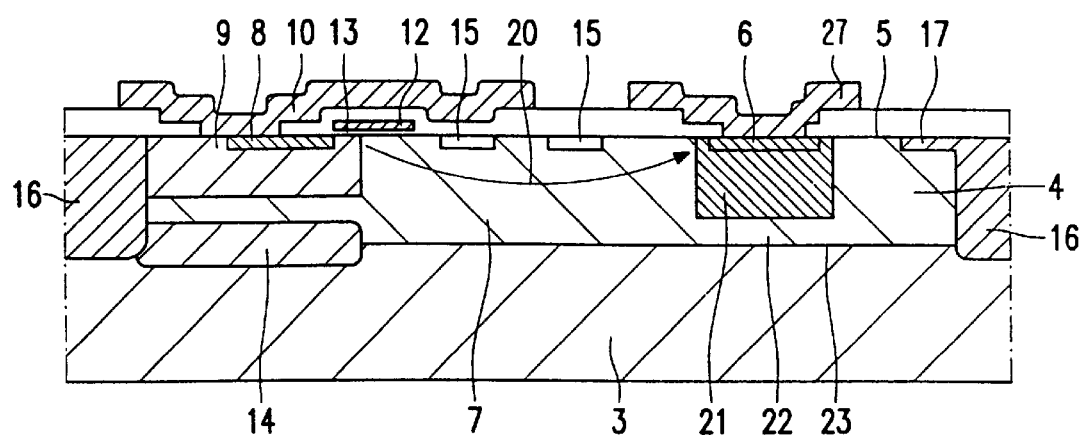
FIG. 3 is a cross-section of a further embodiment of an LDMOST according to the invention.

FIG. 3 shows a further modification of a high-voltage LDMOST according to the invention. Here the drain is provided with a strongly doped n-type surface zone 21 which extends from the surface into the epitaxial layer 4 to a greater depth than does the source zone 8. In an embodiment, the zone 21 may extend over the full thickness of the epitaxial layer 4 and form a pn-junction with the substrate which breaks down at high voltages. In the embodiment shown in the drawing, the zone 21 extends to close to the p-type substrate 3 and is separated therefrom by a portion 22 having the original doping of the epitaxial layer 4. The breakdown voltage of the pn-junction 23 formed between the zone 21 and the substrate 3 is determined not only by the doping concentrations but also by the thickness of the portion 22. It is possible to obtain a higher breakdown voltage in that this thickness is chosen to be sufficiently great. The transistor shown here again shows a high stability also upon breakdown because the breakdown occurs in the region between the zone 21 and the substrate and is thus laterally separated from the current path 20.

The zone 21 may again be manufactured in usual processes without any change in the process. Thus, for example, the zone 21 may be provided simultaneously with a deep collector contact zone in the case of an integrated circuit comprising a bipolar npn transistor.

A deep n-type zone identical to the zone 21 in FIG. 3 may advantageously be used in the examples of FIGS. 1 and 2. This reduces the resistance in the breakdown path in these embodiments, so that more current can be drained off.

It will be obvious that the invention is not limited to the embodiments described here but that many more variations are possible to those skilled in the art within the scope of the invention. Thus a p-type epitaxial layer may alternatively be used in a modification of the embodiments given here, while the n-type drift region is formed by a doped zone provided in the epitaxial layer. It is not necessary, furthermore, for the base region 9 to be connected to the buried layer 14 and the substrate 3 by means of the deep p-type diffusion 16. In alternative embodiments, the base region is separated from the substrate by the n-type epitaxial layer and may in that case be connected to the substrate by means of internal or external wiring, or may be connected to a junction point having a potential which differs from the potential of the substrate.

What is claimed is:

1. A semiconductor device with a high-voltage lateral DMOS transistor (HV-LDMOST), comprising a semiconductor body with a comparatively weakly doped silicon substrate of a first conductivity type and provided thereon a comparatively weakly doped epitaxial layer adjoining a surface of the semiconductor body, while the transistor comprises a comparatively strongly doped drain zone situated at the surface and of a second conductivity type opposed to the first conductivity type, a comparatively weakly doped drift region of the second conductivity type, a comparatively strongly doped source zone of the second conductivity type which adjoins the surface and is provided in a base region of the first conductivity type also adjoining the surface, and a control electrode provided above the surface and electrically insulated from the surface, characterized in that the semiconductor body comprises a strongly doped zone of the second conductivity type which, as seen from the surface, extends more deeply into the semiconductor body than does the source zone and has a major portion located directly beneath said comparatively strongly doped drain zone situated at the surface, so that a pn-junction is formed in the semiconductor body with a breakdown voltage which is lower than the source-drain breakdown voltage of the transistor in the absence of said strongly doped zone of the second conductivity type, and in the case of breakdown forms a current path which is sepated from the current path between source and drain zones when the transistor is in the conducting state.

2. A semiconductor device as claimed in claim 1, wherein a comparatively strongly doped buried zone of the first conductivity type is locally provided adjacent the boundary between the epitaxial layer and the substrate, which zone, seen at the surface, extends from beneath the source zone toward or at least substantially to the drift region.

3. A semiconductor device as claimed in claim 2, characterized in that the strongly doped zone under the drain zone comprises a strongly doped buried zone of the second conductivity type which is provided at the boundary between the epitaxial layer and the substrate at the area under the drain zone.

4. A semiconductor device as claimed in claim 3, characterized in that the distance between the buried zone of the first conductivity type and the buried zone of the second conductivity type is so small that the breakdown voltage between the buried zone of the second conductivity type and the substrate.

5. A semiconductor device as claimed in claim 1, wherein the epitaxial layer is of the second conductivity type, and the drift region is formed by a portion of the epitaxial layer between the drain zone and the base region.

6. A semiconductor device as claimed in claim 1, characterized in that the strongly doped zone under the drain zone comprises a strongly doped buried zone of the second conductivity type which is provided at the boundary between the epitaxial layer and the substrate at the area under the drain zone.

7. A semiconductor device as claimed in claim 1, characterized in that the strongly doped zone under the drain zone comprises a strongly doped surface zone of the second conductivity type which extends from the surface into only the epitaxial layer down to a greater depth than does the source zone.

8. A semiconductor device as claimed in claim 1, characterized in that the drift region is forming according to the RESURF principle.

* * * * *